United States Patent [19]

Makihara et al.

[11] Patent Number: 5,683,529
[45] Date of Patent: Nov. 4, 1997

[54] PROCESS OF PRODUCING ALUMINUM NITRIDE MULTIPLE-LAYER CIRCUIT BOARD

[75] Inventors: Hiroshi Makihara; Koji Omote; Nobuo Kamehara; Mineharu Tsukada, all of Kawasaki, Japan

[73] Assignee: Fujitsu Limited, Kawasaki, Japan

[21] Appl. No.: 661,885

[22] Filed: Jun. 11, 1996

Related U.S. Application Data

[63] Continuation of Ser. No. 187,130, Jan. 27, 1994, abandoned, which is a continuation of Ser. No. 885,975, May 20, 1992, abandoned.

[30] Foreign Application Priority Data

May 21, 1991 [JP] Japan .................. 3-116110

[51] Int. Cl.$^6$ .................................................. C04B 37/00
[52] U.S. Cl. ........................................... 156/89; 264/61
[58] Field of Search ........................... 156/89; 264/61; 419/13, 5, 10

[56] References Cited

U.S. PATENT DOCUMENTS

| | | | |
|---|---|---|---|
| 4,142,662 | 3/1979 | Holbrook et al. | 156/233 |
| 4,608,354 | 8/1986 | Avella et al. | 501/97 |
| 4,724,283 | 2/1988 | Shimada et al. | 361/411 |
| 4,924,033 | 5/1990 | Iyogi et al. | 174/259 |

FOREIGN PATENT DOCUMENTS

| | | |
|---|---|---|
| 0 276 788 | 8/1988 | European Pat. Off. . |
| 60-239366 | 11/1985 | Japan . |
| 63-40772 | 2/1988 | Japan . |
| 63-69764 | 3/1988 | Japan . |
| 2-34568 | 2/1990 | Japan . |
| 2-129076 | 5/1990 | Japan . |
| 2-212365 | 8/1990 | Japan . |
| 2-243570 | 9/1990 | Japan . |
| 3-025288 | 2/1991 | Japan . |
| 4-050172 | 2/1992 | Japan . |

OTHER PUBLICATIONS

*Patent Abstracts of Japan*, vol. 10, No. 255 (E-433)[2311] Sep. 2, 1986 & JP-A-61 84036 (Toshiba Corp.) Apr. 28, 1986 and *World Patents Index Latest*, Week 2386, Derwent Publications Ltd., London, GB; AN 86-148 100 & JP-A-61 84036 (Toshiba Corp.) Apr. 28, 1986.
Tsukada et al., "Metallization of an Aluminum Nitride with a Tungsten Conductor", Proceeding of the Ceramic Society of Japan (Nikon Seramikku Kyotai), Autumn 1989, pp. 82-83 (No Translation Provided).
*Patent Abstracts of Japan*, vol. 15, No. 151 (M-1103) Apr. 16, 1991 & JP-A-3 025288 (Toshiba Ceramics Co. Ltd.) Mar. 20, 1991.
*Patent Abstracts of Japan*, vol. 15, No. 221 (C-838) Jun. 6, 1991 & JP-A-3 065566 (Fujitsu Ltd.) Feb., 4, 1991.
*World Patents Index Latest*, Week 1492, Derwent Publications Ltd., London, GB; AN 92-109 153 & JP-A-4 050172 (Kawasaki Steel KK).

*Primary Examiner*—Christopher A. Fiorilla
*Attorney, Agent, or Firm*—Staas & Halsey

[57] ABSTRACT

A process of producing a multiple-layer circuit board of aluminum nitride, including the steps of: preparing green sheets of aluminum nitride, forming on the green sheets conductor patterns of a conductor paste containing tungsten as a main conductor component, laminating the green sheets with the conductor patterns formed thereon to form a lamination, and firing the lamination in a container made of boron nitride and in a pressurized nitrogen gas atmosphere.

20 Claims, 9 Drawing Sheets

PROCESS OF PRODUCING ALUMINUM NITRIDE MULTIPLE-LAYER CIRCUIT BOARD

This application is a continuation of application Ser. No. 08/187,130, filed Jan. 27, 1994, now abandoned, which is a continuation of application Ser. No. 07/885,975, filed May 20, 1992, now abandoned.

BACKGROUND OF THE INVENTION

1. Field of the Invention

The present invention relates to a process of producing a multiple-layer circuit board of aluminum nitride.

Aluminum nitride, AlN, has a high thermal conductivity and a thermal expansion coefficient comparable with that of silicon used in semiconductor devices, and therefore, is an advantageous replacement for alumina ($Al_2O_3$) as a useful material of packages and circuit boards, particularly a circuit board on which silicon semiconductor devices are mounted.

The circuit is formed of tungsten (W), which can be suitably fired together with aluminum nitride.

2. Description of the Related Art

A multiple-layer aluminum nitride circuit board having a circuit pattern of tungsten is produced by firing, usually in the following sequence.

An aluminum nitride powder, a sintering additive, a solvent, and an organic binder are mixed by milling to form a slurry, which is then subjected to a doctor blade process to form a green sheet; a plurality of green sheets are prepared in the same manner.

Via-contact holes are formed in several green sheets and filled with a conductor paste or a tungsten paste, and circuit patterns of a conductor paste (tungsten paste) are formed on the remaining green sheets by screen printing. It is possible for via-contact holes to be formed in one green sheet and filled with a conductor paste, and circuit patterns are then screen printed on the green sheet.

A predetermined number of the green sheets are then laminated and pressurized to form an integral lamination, and this green sheet lamination is dried, degreased by heating (or a binder is removed), and fired to form a multiple-layer aluminum nitride circuit board.

When the firing is carried out, special attention must be paid to the material of a container coexisting in the firing atmosphere, particularly the container accommodating the green sheet lamination, with regard to the following points.

Because aluminum nitride is fired at a high temperature of 1600° C. or higher, as disclosed in Japanese Unexamined Patent Publication (Kokai) Nos. 60-239366, 2-212365 and 2-243570, for example, a firing container containing a green sheet lamination during firing and a load setter must be made of a high heat-resistant material. Practically available materials having such a high heat-resistance include boron nitride (BN) and graphite (C). Graphite is less expensive and is preferable from the viewpoint of production cost, but generates a carbonaceous atmosphere during firing to thereby decompose aluminum nitride and cause a sublimation thereof.

To eliminate this problem, the inner surface of a graphite container is coated with a boron nitride powder, and a green sheet lamination is packed together with an aluminum nitride powder surrounding the lamination in a graphite container, as proposed in Japanese Unexamined Patent Publication (Kokai) No. 2-34568. This method, however, has a disadvantage in that the placing of a green sheet lamination in a graphite container occasionally causes a non-uniform firing of the product aluminum nitride board, the setting of a green sheet lamination for firing requires a long time, and the aluminum nitride powder used for packing incurs an additional cost.

Boron nitride (BN) can be advantageously used to eliminate these disadvantages of graphite, but when used as a firing container, causes a problem in that BN diffuses into W of the circuit conductor and forms tungsten boride ($W_2B$), which increases the resistivity of the circuit conductor (Proceeding of the Ceramic Society of Japan, 1989, Autumn, p.82).

SUMMARY OF THE INVENTION

The object of the present invention is to eliminate the above-mentioned problem of the conventional methods and provide a process of producing a multiple-layer aluminum nitride circuit board by using a firing container of boron nitride without causing an increase in the resistivity of a tungsten conductor.

To achieve the object according to the present invention, there is provided a process of producing a multiple-layer circuit board of aluminum nitride, comprising the steps of:

preparing green sheets of aluminum nitride;

forming on the green sheets conductor patterns of conductor paste containing tungsten as a main conductor component;

laminating the green sheets with the conductor patterns formed thereon to form a lamination; and firing the lamination in a container made of boron nitride in a pressurized nitrogen gas atmosphere.

DESCRIPTION OF THE PREFERRED EMBODIMENTS

The increase in the resistivity of a W conductor is caused by the fact that the BN is released from a BN container during firing and reacts with the conductor W to form $W_2B$ in the conductor.

The present invention uses a firing atmosphere of a pressurized nitrogen gas to suppress the release of BN from a BN container, and in turn the reaction between BN and W, and thereby prevents the increase in the resistivity of a W conductor.

When the firing is carried out in a pressurized nitrogen gas atmosphere of 3 atm or more, the increase in resistivity of a W conductor is substantially completely prevented.

The upper limit of the pressure of a pressurized nitrogen gas atmosphere need not be specified, but a nitrogen gas pressure higher than 10 atm does not provide a further advancement in the prevention of the increase in the conductor resistivity and only raises the production cost. Accordingly, the nitrogen gas pressure is suitably limited to not higher than 10 atm, in practice.

According to a preferred embodiment of the present invention, care is taken to further effectively prevent the distortion of an aluminum nitride circuit board and the exfoliation of a W conductor, which unavoidably occur in the conventional firing.

In the conventional process, a green sheet lamination is loaded with a weight during the firing thereof, to prevent a distortion of a fired board that occurs upon the removal of a sintering additive and an impurity oxygen from a fired or sintered product, as proposed in Japanese Unexamined Patent Publication (Kokai) No. 2-129076. This method, however, causes a problem in that the patterned conductor of a green sheet lamination is transferred to a load setter for loading the weight, and that the factor of shrinkage of a fired board undesirably varies between different positions of the same board.

The conventional process also has a problem in that an AlN substrate and a W circuit conductor formed thereon have different shrinkage factors during firing, and therefore, have a poor bonding therebetween, and this frequently causes an exfoliation of the W conductor from the AlN substrate.

A conductor paste having a conductor component of W and supplemented with an AlN powder in an amount of 10 wt % or less can be advantageously used to solve these conventional problems according to the present invention, particularly to prevent the distortion of AlN board and the exfoliation of W conductor due to the difference between the shrinkage factors of the AlN board and the W conductor. When the distortion of an AlN board must be primarily prevented, an AlN powder is preferably contained in a conductor paste in an amount of 3 wt % or more.

To ensure a high thermal conductivity of a fired AlN board, an AlN green sheet having a conductor pattern of a conductor paste formed thereon should be fired at a high temperature of 1600° C. or higher. Usually, this firing is sufficiently effective when carried out for about 2 hours.

After a primary high temperature firing carried out at a temperature of 1600° C. or higher in a BN container, a secondary low temperature firing is preferably carried out without using a BN container at a temperature lower than 1600° C. in a non-oxidizing gas atmosphere not containing carbon, to decompose any $W_2B$ formed during the primary high temperature firing to return to W, and thereby make the resistivity of the W conductor lower than that caused by the primary high temperature firing.

A firing atmosphere not containing carbon is used in order to prevent a reaction of the conductor W with the atmosphere carbon and the resulting formation of $W_2C$ having a high resistivity, and to prevent an oxidization of AlN and the resulting formation of $Al_2O_3$. Such non-oxidizing gas atmospheres not containing carbon include hydrogen, nitrogen, argon, and the like.

EXAMPLE 1

An AlN powder containing 1% impurity oxygen was blended with 5 wt % of a $Y_2O_3$ powder as a sintering additive, a solvent (MEK), and an organic binder (PMMA) and was milled in a ball mill to form a slurry, which was then spread by a doctor blade process to form a 300 μm thick, 90 by 90 mm, square AlN green sheet.

A W powder was blended with a solvent (MEK, terpineol) and an organic binder (PMMA) and milled in a ball mill to form a slurry, which was then agitated in an automated mortar to scatter the MEK in the air and roll-milled to form a W paste.

The W paste was screen-printed on the AlN green sheet to form a conductor pattern of the W paste having a width of 200 μm, a length of 40 mm, and a height of 25 μm. Eight pieces of the green sheet were laminated at a temperature of 60° C. and a pressure of 50 MPa to form an 8-layer lamination.

After being dried, the laminations were degreased in a nitrogen gas flow at 600° C. for 4 hours to remove the organic binder, placed in a BN container, and fired at a temperature of 1700° C. in pressurized nitrogen gas atmospheres of 1 to 10 atm for 9 hours to form multiple-layer AlN circuit boards.

The surface of the W conductor of the multiple-layer AlN circuit board was subjected to a measurement of the resistivity and an X-ray diffraction analysis, the results of which are summarized in Table 1.

It is also possible for AlN green sheets to be drilled to form throughholes, a W paste filled in the throughholes to form via-contacts, a W paste screen-printed on the AlN green sheets to form conductor patterns, and the AlN green sheets having the thus-formed via-contacts and conductor patterns being laminated, degreased and fired to form a multiple-layer AlN circuit board.

TABLE 1

| Firing pressure (atm) | Sheet resistivity (mΩ/square) | Surface product |
|---|---|---|
| 1 | 25 (63.5) | W2B |
| 2 | 15 (38.1) | W2B + W |
| 3 | 10 (25.4) | W + W2B |
| 5 | 10 (25.4) | W + W2B |
| 7 | 9 (22.8) | W + W2B |
| 10 | 8 (20.3) | W |

Note)
W2B: substantially $W_2B$ only detected.
W2B + W: $W_2B$ and small amount of W detected.
W + W2B: W and small amount of $W_2B$ detected.
W: substantially W only detected.

The sheet resistivities are expressed in terms of the converted values for a sheet thickness of 1 mil (25.4 μm).

The parenthesized values are the volume resistivities, in µΩ-cm, converted from the sheet resistivities.

It can be seen from Table 1 that the pressurized nitrogen gas atmosphere, particularly when pressurized to 3 atm or more, effectively suppresses the formation of $W_2B$ in the W conductor, and therefore, suppresses the increase in the resistivity of the W conductor.

EXAMPLE 2

An AlN powder containing 1% impurity oxygen was blended with 5 wt % of a $Y_2O_3$ powder as a sintering additive, a solvent (MEK), and an organic binder (PMMA) and was milled in a ball mill to form a slurry, which was then spread by a doctor blade process to form a 300 µm thick, 90 by 90 mm, square AlN green sheet.

An AlN powder was added to a W powder at various amounts up to 10 wt %. The W powder was blended with a solvent (MEK, terpineol) and an organic binder (PMMA) and milled in a ball mill to form a slurry, which was then agitated in an automated mortar to scatter the MEK in the air and roll-milled to form a W paste.

A W paste without an addition of AlN powder was prepared for comparison.

The W paste was screen-printed on the AlN green sheet to form a conductor pattern of W having a width of 200 µm, a length of 40 mm, and a height of 25 µm, to form a "conductor pattern sheet". Another AlN green sheet was drilled to form throughholes having a diameter of 200 µm and the W paste was filled in the throughholes, to form a "via-contact sheet".

The conductor pattern sheets and the via-contact sheets were alternately laminated to form a 6-layer lamination.

After being dried, the laminations were degreased in a nitrogen gas flow at 600° C. for 4 hours to remove the organic binder, placed in a BN container, and fired at various temperatures of from 1400° to 1900° C. in pressurized nitrogen gas atmospheres of 1 to 9 atm to form multiple-layer AlN circuit boards.

The surface of the W conductor of the multiple-layer AlN circuit board was subjected to a measurement of the resistivity and an X-ray diffraction analysis.

A non-laminated or single AlN green sheets were fired under the same condition as the above and used for the measurement of the sintered density and the thermal conductivity of the fired product board.

The results obtained from these measurements are described in detail below.

Firing Temperature and Time

Figure 1:
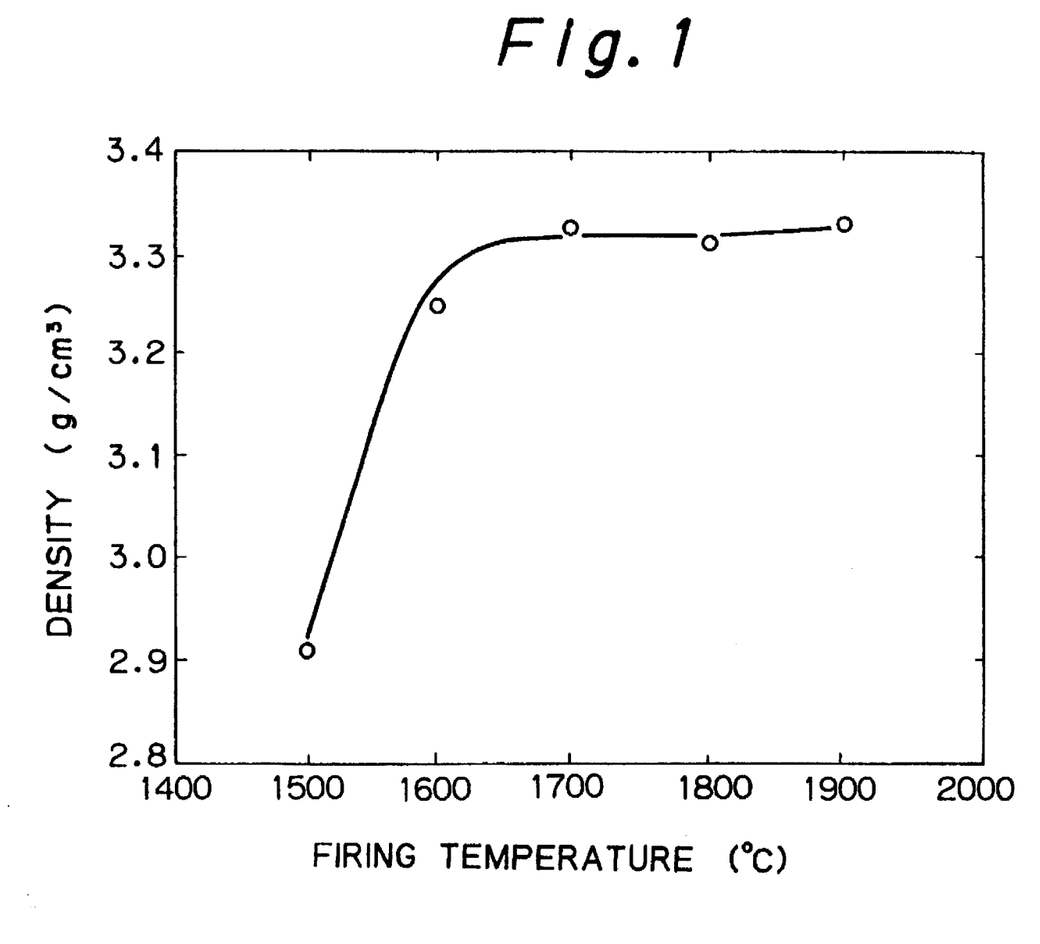
FIG. 1 is a graph showing the relationship between the firing temperature and the sintered density of a fired AlN circuit board.
Figure 2:
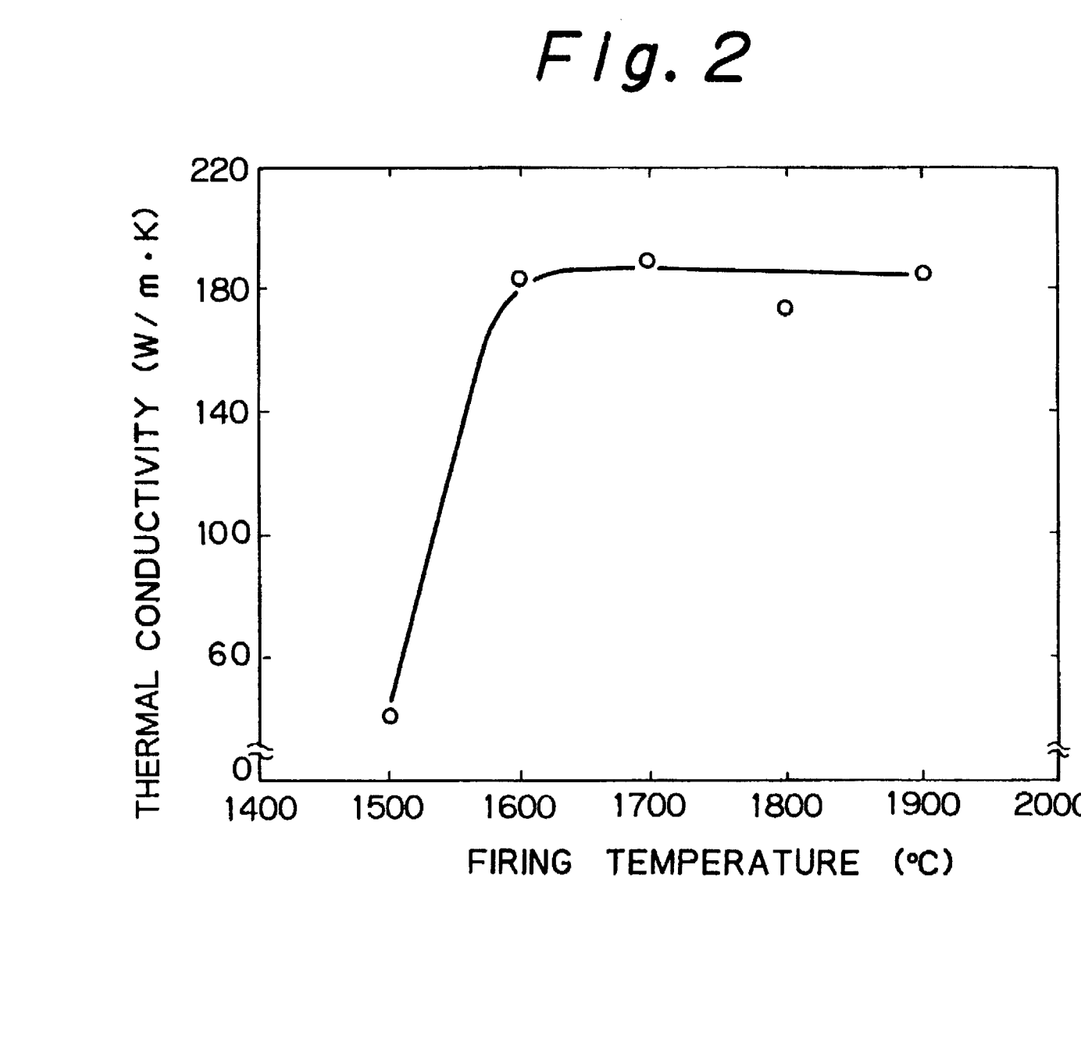
FIG. 2 is a graph showing the relationship between the firing temperature and the thermal conductivity of a fired AlN circuit board.

FIG. 1 shows the relationship between the firing temperature and the sintered density of the fired AlN board, and FIG. 2 shows the relationship between the firing temperature and the thermal conductivity of the fired AlN board.

It can be seen from FIG. 1 that, to obtain a sintered density comparable with the theoretical density, the firing temperature must not be lower than 1600° C. and that a firing temperature of 1650° C. or higher provides a sintered density of about 100% of the theoretical density. It can be seen from FIG. 2 that a firing temperature of 1600° C. or higher also provides a high thermal conductivity of 180 W/mk or higher.

Figure 3:
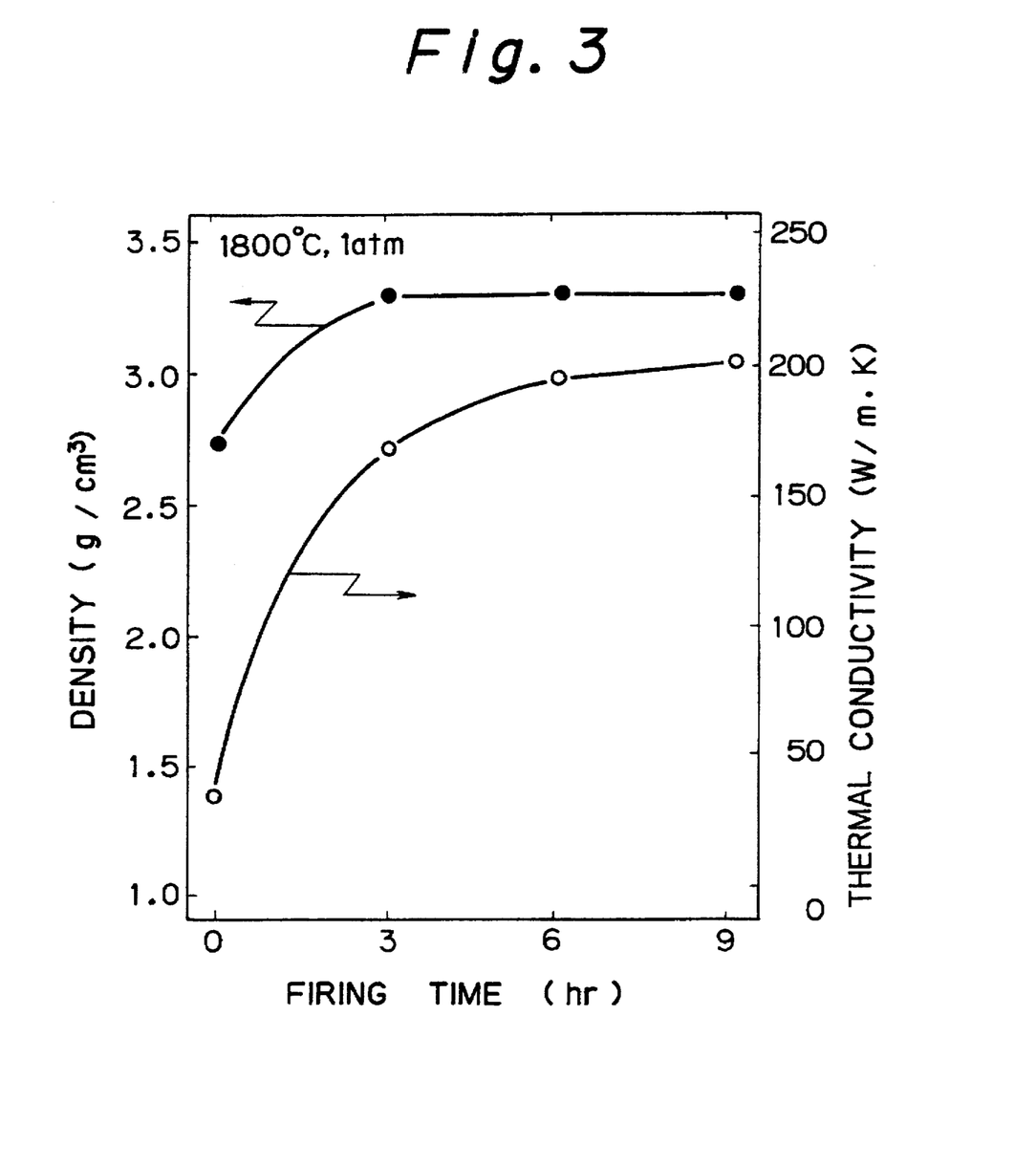
FIG. 3 is a graph showing the sintered density and the thermal conductivity of a fired AlN circuit board as a function of the firing time at a firing temperature of 1800° C.

FIG. 3 shows the sintered density and the thermal conductivity of a fired AlN board as a function of the firing time at a firing temperature of 1800° C. It can be seen from FIG. 3 that, to obtain a high density and thermal conductivity, the firing is carried out for preferably 2 hours or more, more preferably 3 hours or more.

Firing Pressure and AlN Amount in W Paste

Figure 4:
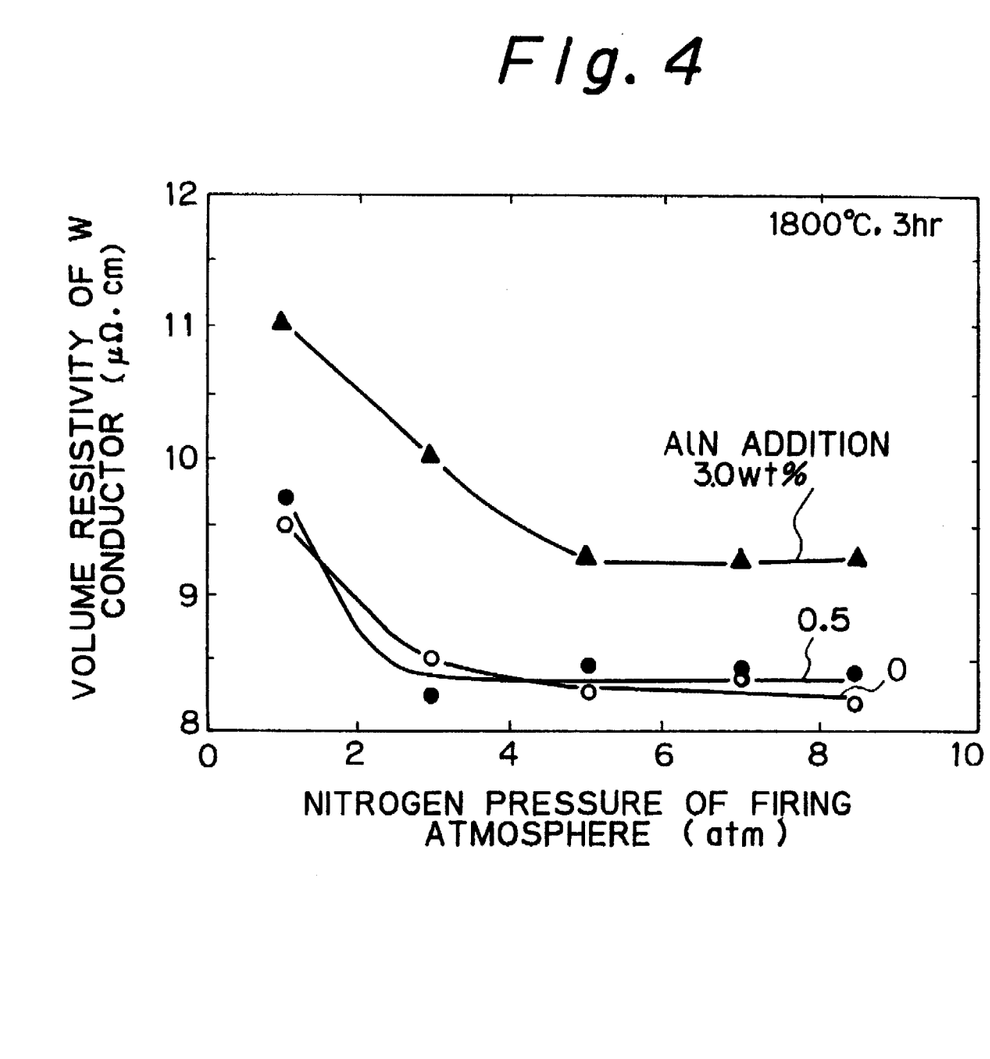
FIG. 4 is a graph showing the relationship between the pressure of the pressurized nitrogen gas atmosphere used for firing and the volume resistivity of the product circuit conductor of W.

FIG. 4 shows the relationship between the pressure of the pressurized nitrogen gas atmosphere used in firing and the volume resistivity of the obtained W conductor. The resistivity exhibits a clear decrease even under a pressurization of 1 atm and a pressurization of 3 atm or more stably ensures a low resistivity. It also can be seen from FIG. 4 that the greater the amount of AlN powder added, the higher the resistivity, and therefore, the amount of AlN powder added should be a necessary minimum when as low as possible a resistivity is required.

Figure 5:
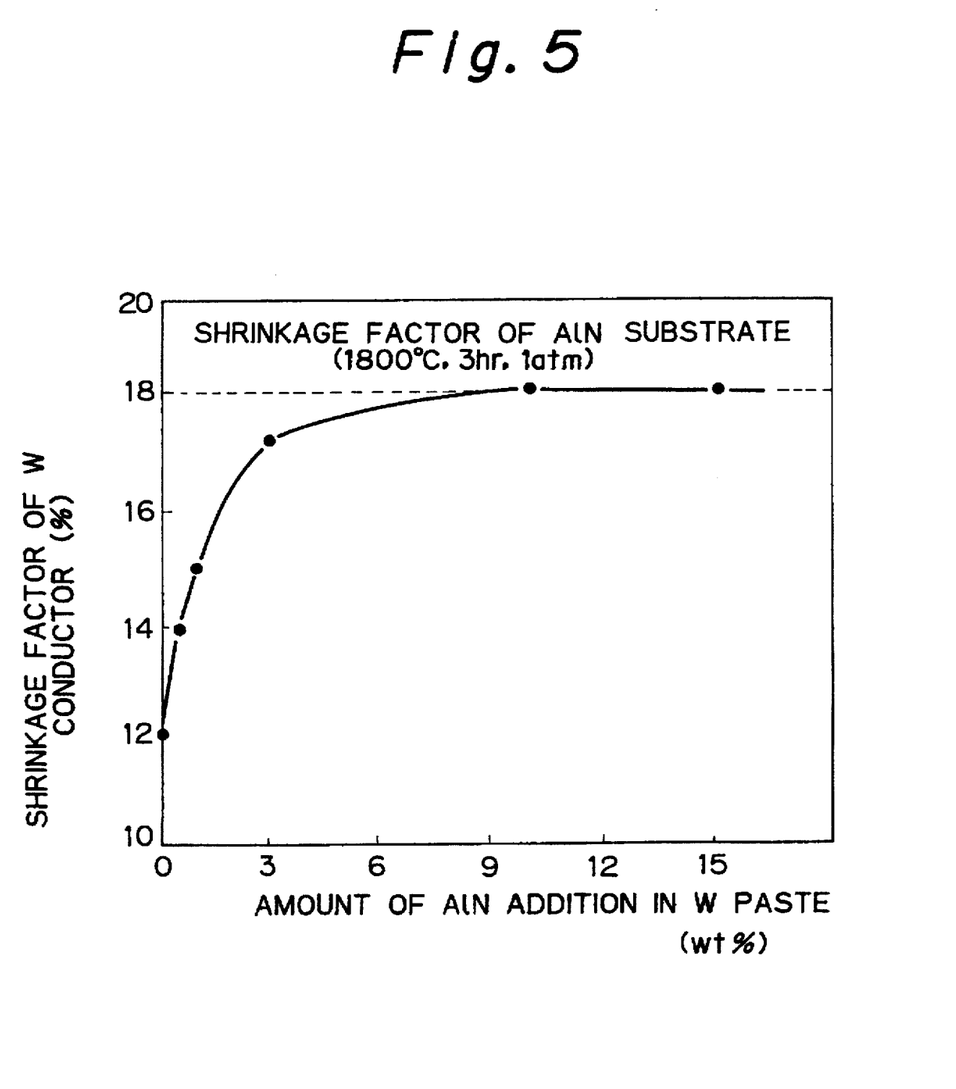
FIG. 5 is a graph showing the relationship between the amount of the AlN powder added and the shrinkage factor of the W conductor.

FIG. 5 shows the relationship between the amount of AlN added and the shrinkage factor of the W conductor. The shrinkage factor of the W conductor rapidly approaches the shrinkage factor of the substrate AlN at a small amount of AlN added in the range of up to 3 wt %, the rate of approach slows when the amount of AlN added exceeds 3 wt %, and in the range of 10 wt % or more, the shrinkage factor of the W conductor becomes substantially equal to that of the AlN substrate.

The shrinkage factor of the W conductor is desirably as close as possible to that of the substrate AlN, to prevent the thermal distortion of the AlN substrate and the exfoliation of the W conductor. An amount of AlN added of more than 10 wt % does not provide a further approach of the two shrinkage factors. The amount of AlN added should not be more than 10 wt % because the amount of AlN added is desirably as small as possible, to ensure as low as possible a resistivity of the W conductor.

Figure 6:
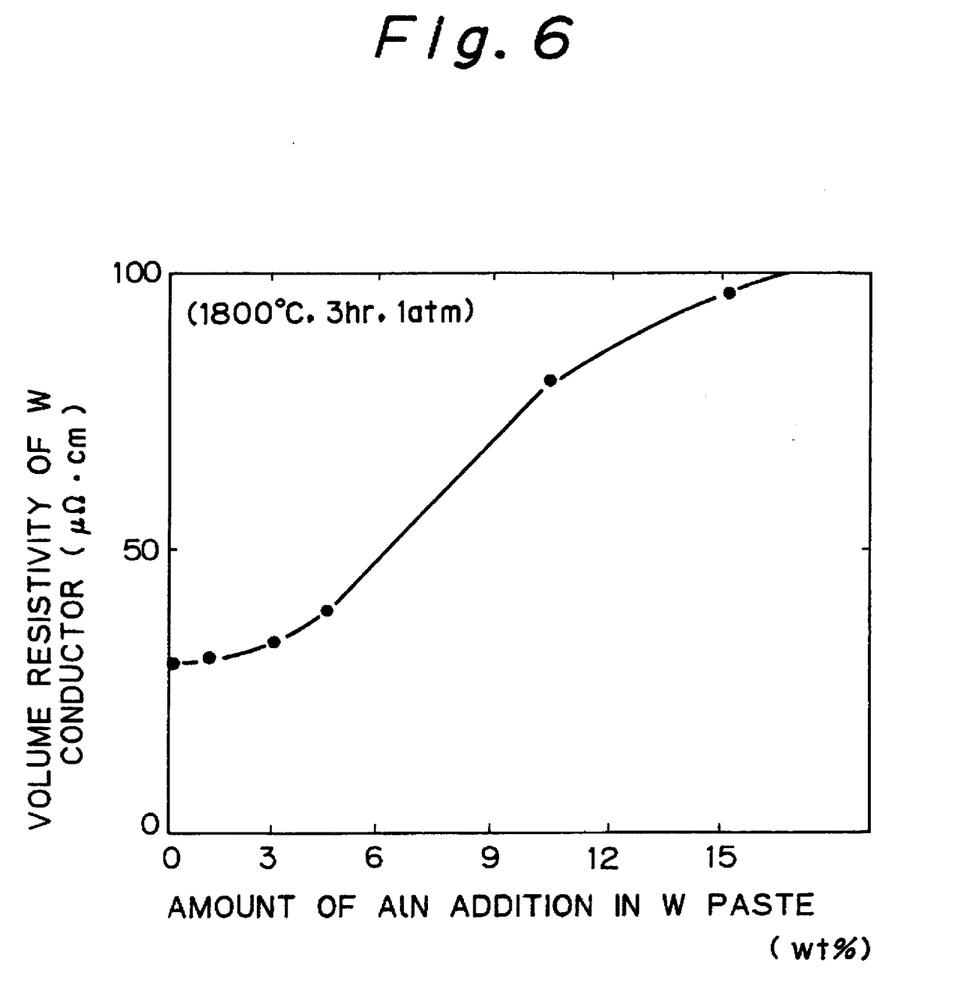
FIG. 6 is a graph showing the relationship between the amount of the AlN powder added and the volume resistivity of the W conductor.

FIG. 6 shows the relationship between the amount of AlN added and the resistivity of the W conductor. The resistivity of the W conductor is substantially unchanged and kept at a low value when an AlN powder is added in an amount up to 3 wt %, and is increased when the amount of AlN added is more than 3 wt %.

Figure 7:
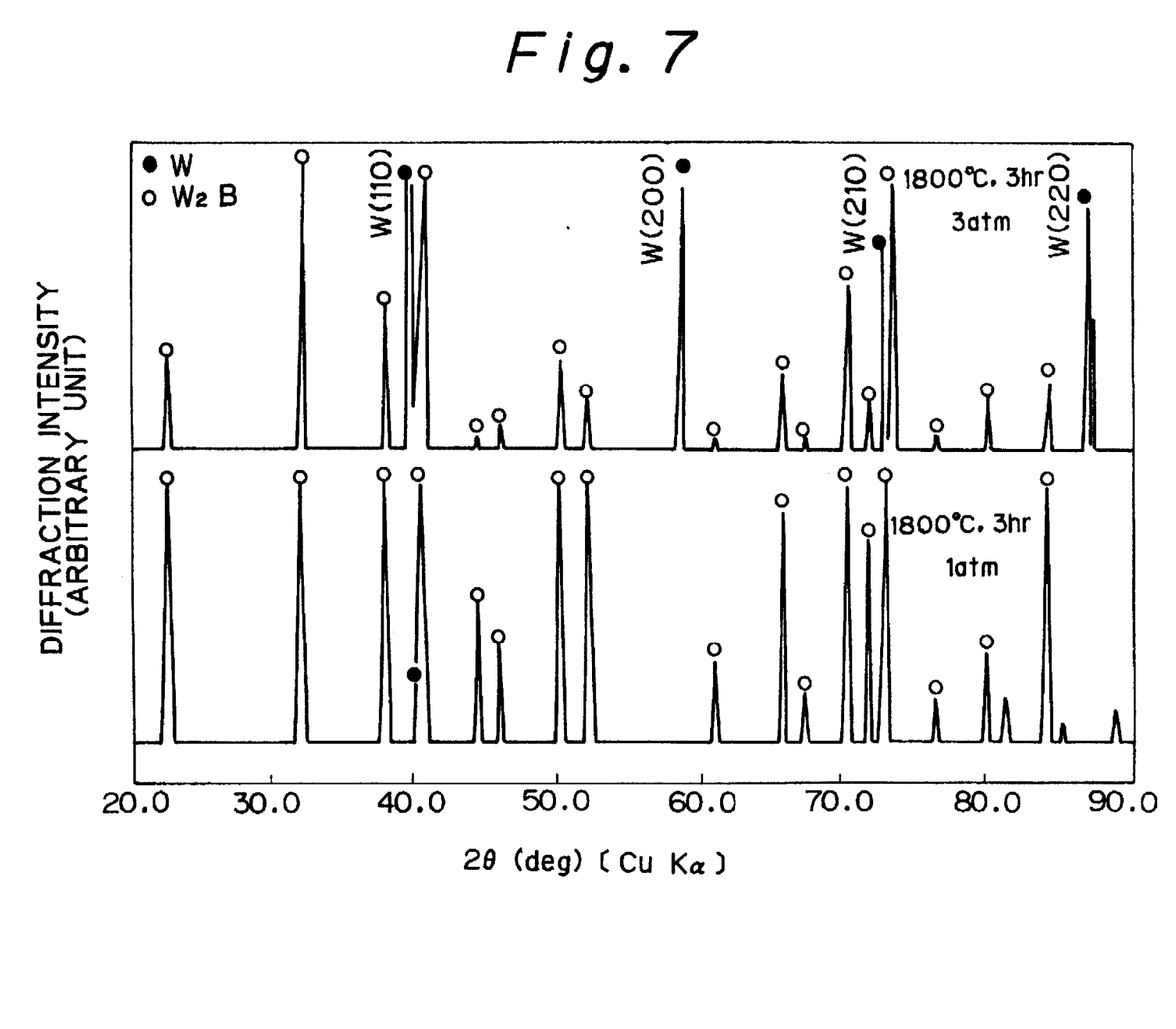
FIG. 7 is a graph showing X-ray diffraction patterns of the surface of the W conductors obtained by the conventional firing carried out under the normal pressure of 1 atm and the present inventive firing carried out under a raised pressure of 3 atm.

FIG. 7 shows X-ray diffraction patterns of the surface of the W conductors obtained by a conventional process in which firing was carried out in a nitrogen gas atmosphere under a normal pressure of 1 atm, and by a process according to the present inventive in which firing was carried out in a nitrogen gas atmosphere under a pressurization of 3 atm, respectively. The W conductor obtained by the conventional normal pressure firing exhibits a large diffraction peak from $W_2B$, whereas the W conductor obtained by the present inventive pressurized firing only exhibits a minute diffraction peak from $W_2B$, i.e., the formation of $W_2B$ is effectively suppressed by the present inventive process.

EXAMPLE 3

AlN green sheets and a W paste were prepared in the same manner as in Example 2, except that the amount of AlN added in the W paste was varied in the range of from 0.5, 3, 10 to 20 wt % and a W paste without an addition of AlN was also prepared, for comparison.

In screen-printing of the W paste on the AlN green sheets, a circuit pattern was printed on an AlN green sheet to provide the second layer of a green sheet lamination, and a blank pattern was printed on a green sheet to provide the fourth layer of the lamination. The thus-prepared green sheets were laminated to form a 8-layer lamination.

The lamination was fired in a pressurized nitrogen gas flow at a pressure of 3 atm and a temperature of 1700° C. for 9 hours. The fired product of multiple-layer AlN circuit board was subjected to measurements of the board distortion, the adhesive strength of conductor, and the resistivity of the conductor of an inside layer. The results are summarized in Table 2.

TABLE 2

| Amount of AlN added (wt %) | Not added | 0.5 | 3 | 10 | 20 |
|---|---|---|---|---|---|
| Distortion of circuit board | B | B | A | A | A |
| Adhesive strength | C | B | A | AA | AA |
| Volume resistivity ($\mu\Omega$-cm) | 8.5 | 8.5 | 10 | 16 | 38 |

Note)
Distortion ($\mu$m/100 mm)
B: 5–10
A: 0–5
Adhesive strength (kg/cm$^2$)
C: 0–1
B: 1–2
A: 2–2.5
AA: 2.5 or more It can be seen from Table 2 that the board distortion is obviously suppressed when AlN is added in an amount of 3 wt % or more, the adhesive strength of the W conductor is improved at a smaller amount of AlN added of 0.5 wt %, and the conductor resistivity of an inside layer is gradually increased when AlN is added in an amount up to 10 wt % and rapidly increased when the amount of AlN added exceeds 10 wt %. To consider all of these situations, a W paste preferably contains an AlN powder in an amount of up to 10 wt %.

The preferred embodiments described in Examples 2 and 3 not only prevent the increase in the resistivity of the W conductor due to the formation of W$_2$B when a firing container of BN is used, but also avoid the transfer of the conductor pattern from an AlN sheet to a load setter and the fluctuation of the shrinkage factor of an AlN board depending on a loaded weight.

EXAMPLE 4

An AlN powder containing 1% impurity oxygen was blended with 5 wt % of a Y$_2$O$_3$ powder as a sintering additive, a solvent (MEK), and an organic binder (PMMA) and was milled in a ball mill to form a slurry, which was then spread by a doctor blade process to form a 300 $\mu$m thick, 90 by 90 mm, square AlN green sheet.

An AlN powder was added to a W powder in various amounts up to 10 wt %. The W powder was blended with a solvent (MEK, terpineol) and an organic binder (PMMA) and milled in a ball mill to form a slurry, which was then agitated in an automated mortar to scatter the MEK in the air and roll-milled to form a W paste.

A W paste without an addition of AlN powder was prepared for comparison.

The W paste was screen-printed on the AlN green sheet to form a conductor pattern of W having a width of 200 $\mu$m, a length of 40 mm, and a height of 25 $\mu$m, to form a "conductor pattern sheet". Another AlN green sheet was drilled to form throughholes having a diameter of 200 $\mu$m and the W paste was filled in the throughholes, to form a "via-contact sheet".

The conductor pattern sheets and the via-contact sheets were alternately laminated to form an 8-layer lamination.

After being dried, the laminations were degreased in a nitrogen gas flow at 600° C. for 4 hours, to remove the organic binder, placed in a BN container, loaded by a load setter of BN, and fired at a temperature of 1800° C. for 3 hours in a pressurized nitrogen gas atmosphere of 1 atm. This firing is referred to as a primary or high temperature firing.

The laminations were further fired at 1400° C. for 1 hour to form multiple-layer AlN circuit boards. This firing is referred to as a secondary or low temperature firing.

The secondary firing was carried out at a pressure of 1 atm in an atmosphere of hydrogen, nitrogen or argon gases not containing carbon.

A secondary firing was also carried out in a nitrogen gas atmosphere containing carbon, for comparison.

An X-ray diffraction analysis was carried out for the surface of the W conductor formed on the surface of the product AlN boards.

Figure 8:
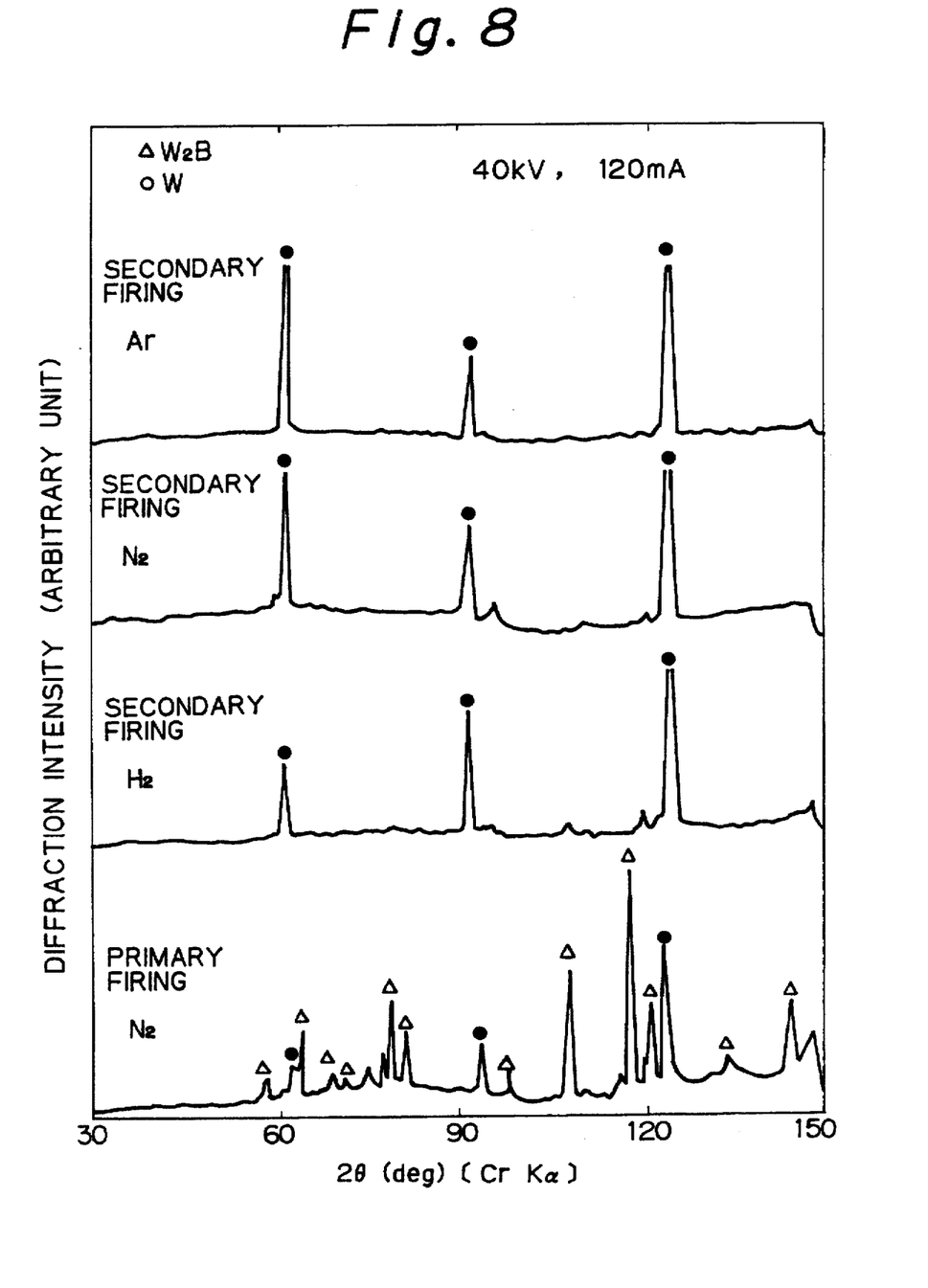
FIG. 8 is a graph showing X-ray diffraction patterns of the surface of the W conductors formed by the primary- and secondary-firing steps, in which the secondary firing atmosphere does not contain carbon.
Figure 9:
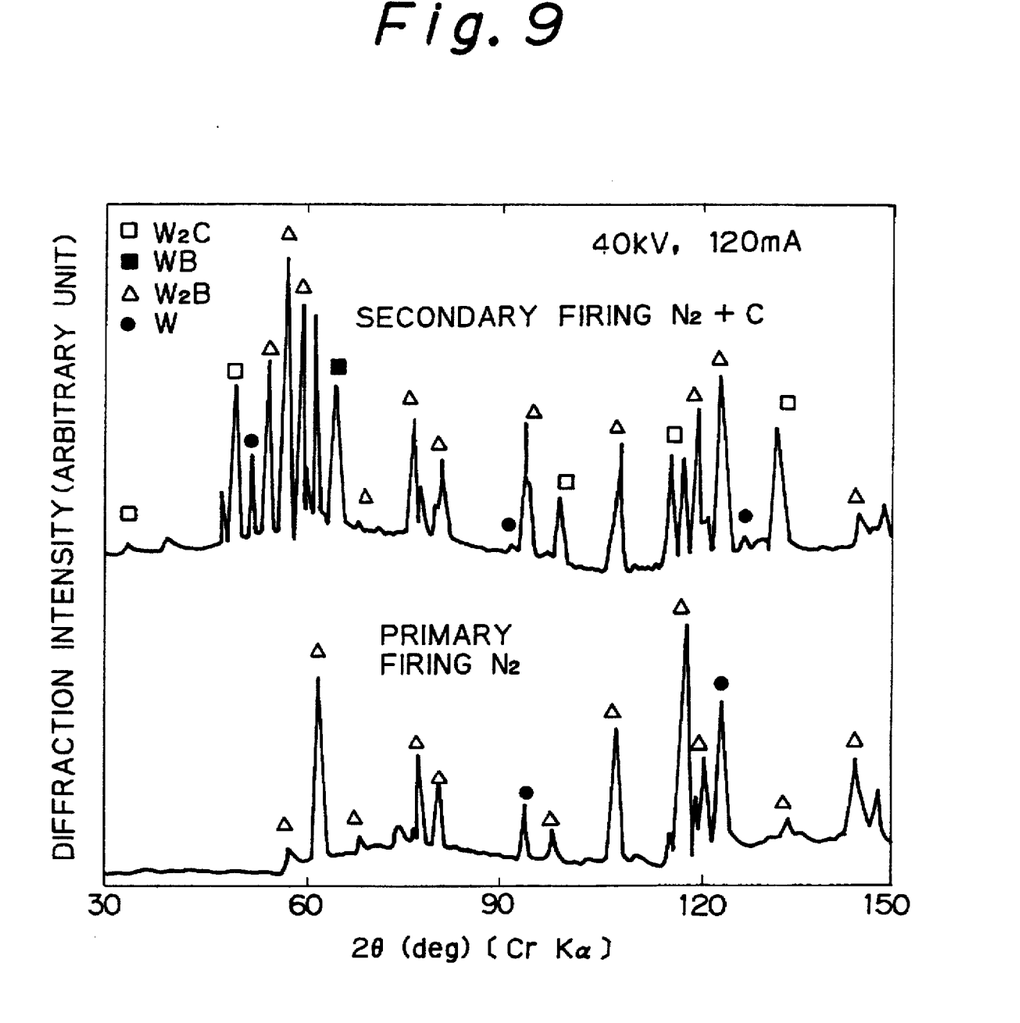
FIG. 9 is a graph showing X-ray diffraction patterns of the surface of the W conductors formed by the primary- and secondary-firing steps, in which the secondary firing atmosphere contains carbon.

FIGS. 8 and 9 show the X-ray diffraction patterns of the W conductors in the primary- and secondary-fired states for atmospheres containing and not containing carbon. Table 3 summarizes the resistivities of the W conductor in the primary- and secondary-fired states and the percent reduction of the resistivity from the primary- to the secondary-fired states.

TABLE 3

| Secondary firing | | Sheet resistivity | | |
|---|---|---|---|---|
| Carbon | Atmosphere gas | Primary-fired ($\mu\Omega$/square) | Secondary-fired ($\mu\Omega$/square) | Reduction (%) |
| Not contained | Hydrogen | 35.3 (53) | 8.0 (12) | 77 |
| | Nitrogen | 34.6 (52) | 8.6 (13) | 75 |
| | Argon | 38.6 (58) | 9.3 (14) | 76 |
| Contained | Nitrogen | 36.7 (55) | 31.3 (47) | 15 |

Note: The parenthesized values of the resistivity refer to the corresponding volume resistivity in m$\Omega$-cm.

It can be seen from FIG. 8 and Table 3 that, when the secondary firing is carried out in a firing atmosphere of a non-oxidizing gas (hydrogen, nitrogen, or argon) not containing carbon, the W$_2$B formed during the primary firing is thermally decomposed during the secondary firing to form a conductor substantially of W only, providing a further decreased resistivity of the W conductor.

On the other hand, FIG. 9 and Table 3 show that, when the secondary firing is carried out in a firing atmosphere of a non-oxidizing gas (nitrogen, in this case) containing carbon, W$_2$C is formed on the surface of the W conductor, and thus the resistivity decrease due to the decomposition of W$_2$B is not sufficiently obtained.

According to the preferred embodiment of the present invention described in Example 4, the board distortion and the conductor exfoliation is prevented by the AlN addition to the W conductor, and simultaneously, the W$_2$B formed during the primary firing is thermally decomposed during the secondary firing to further reduce the resistivity of the W conductor.

As described above, the present invention provides a process for producing a multiple-layer aluminum nitride circuit board by preventing the resistivity increase of the W conductor that would otherwise occur when a firing container of boron nitride is used.

A further advantage is additionally provided by the addition of aluminum nitride in a tungsten paste, whereby both the thermal distortion of the aluminum nitride board and the exfoliation of the tungsten conductor are effectively prevented without using the conventional loading of weight.

A still further advantage is additionally provided by a secondary, low temperature firing whereby the $W_2B$ formed during a primary, high temperature firing is thermally decomposed to further promote the decrease of the conductor resistivity.

We claim:

1. A process of producing a multiple-layer circuit board of aluminum nitride, comprising the steps of:

preparing green sheets of aluminum nitride;

forming, on said green sheets, conductor patterns of a conductor paste containing tungsten powder as a main conductor component;

laminating said green sheets with said conductor patterns formed thereon to form a lamination; and firing said lamination in a sequence of a primary-firing step and a secondary-firing step, the lamination being placed in a container made of boron nitride solely during the primary firing-step, further comprising:

in said primary-firing step, firing said lamination in said container made of boron nitride at a temperature of at least 1600° C. and in a nitrogen gas atmosphere pressurized to at least 3 atm., and in said secondary-firing step, firing said primary-fired lamination at a temperature in a temperature range of from 1400° C. to 1600° C. and in a non-oxidizing gas atmosphere not containing carbon.

2. A process according to claim 1, wherein said conductor paste contains a further component comprising aluminum nitride powder in an amount of 10 wt % or less of the weight of the main conductor component.

3. A process according to claim 2, wherein said conductor paste contains a further component comprising aluminum nitride powder in an amount of 3 wt % or more of the weight of the main conductor component.

4. A process as recited in claim 1 wherein said conductor paste contains a further component comprising aluminum nitride powder in an amount of 3 wt % of the weight of the main conductor component.

5. A process as recited in claim 1 further comprising performing the primary-firing step for approximately two hours.

6. A process as recited in claim 1 wherein the secondary-firing step is performed for approximately 1 hour.

7. A process of producing a multiple-layer circuit board of aluminum nitride, comprising the steps of:

preparing green sheets of aluminum nitride;

forming, on said green sheets, conductor patterns of a conductor paste containing tungsten powder as a main conductor component;

laminating said green sheets with said conductor patterns formed thereon to form a lamination;

primary-firing said lamination in a container made of boron nitride at a temperature of at least 1600° C. and in a nitrogen gas atmosphere pressurized to at least three atm.;

removing the lamination from said container made of boron nitride; and secondary-firing said primary-fired lamination at a temperature in a temperature range of from 1400° C. to 1600° C. and in a non-oxidizing gas atmosphere not containing carbon.

8. A process according to claim 7, wherein said conductor paste contains a further component comprising aluminum nitride powder in an amount of 10 wt % or less of the weight of the main conductor component.

9. A process according to claim 8, wherein said conductor paste contains a further component comprising aluminum nitride powder in an amount of 3 wt % or more of the weight of the main conductor component.

10. A process as recited in claim 7 wherein said conductor paste contains a further component comprising aluminum nitride powder in an amount of 3 wt % of the weight of the main conductor.

11. A process as recited in claim 7 further comprising performing the primary-firing step for approximately two hours.

12. A process as recited in claim 7 wherein the secondary-firing step is performed for approximately 1 hour.

13. A process of producing a multiple-layer circuit board of aluminum nitride, comprising the steps of:

preparing green sheets of aluminum nitride;

forming, on said green sheets, conductor patterns of a conductor paste containing tungston powder as a main conductor component;

laminating said green sheets with said conductor patterns formed thereon to form a lamination; and firing said lamination in a sequence of a primary-firing step and a secondary-firing step, the lamination being placed in a container made of boron nitride solely during the primary firing-step, further comprising:

in said primary-firing step, firing said lamination in said container made of boron nitride at a temperature of at least 1600° C. and in a nitrogen gas atmosphere pressurized to a level selected to suppress release of boron nitride from the boron nitride container, thereby to prevent any substantial reaction of released boron nitride with the tungsten conductor component of the conductor patterns and resulting formation of tungsten boride producing an increased resistivity of the conductor patterns, and the conductor paste containing a further component comprising aluminum nitride powder in an amount of at least 3 wt % of the weight of the main conductor component, the temperature and the duration of the primary-firing step being selected to achieve a desired high level of thermal conductivity of the fired said lamination, and in said secondary-firing step, firing said primary-fired lamination at a temperature in a temperature range of from 1400° C. to 1600° C. and in a non-oxidizing gas atmosphere not containing carbon, the temperature and the duration of the secondary-firing step being selected so as to decompose substantially all of any tungsten boride formed during the primary-firing step and thereby to eliminate said increased resistivity of the conductor patterns produced by the primary-firing step.

14. A process as recited in claim 13 further comprising performing the primary-firing step for approximately two hours.

15. A process as recited in claim 13 wherein the secondary-firing step is performed for approximately one hour.

16. A process according to claim 13, wherein said conductor paste contains a further component comprising aluminum nitride powder in an amount of up to 10 wt % of the weight of the main conductor component.

17. A process of producing a multiple-layer circuit board of aluminum nitride, comprising the steps of:

preparing green sheets of aluminum nitride;

forming, on said green sheets, conductor patterns of a conductor paste containing tungsten powder as a main conductor component and a further component comprising aluminum nitride powder, selected in respective amounts such that the conductor patterns formed on said green sheets comprise the further component in an amount of at least 3 wt % of the weight of the main conductor component;

laminating said green sheets with said conductor patterns formed thereon to form a lamination; and firing said lamination in a sequence of a primary-firing step and a secondary-firing step, the lamination being placed in a container made of boron nitride solely during the primary firing-step, further comprising:

in said primary-firing step, firing said lamination in said container made of boron nitride at a temperature of at least 1600° C. and in a nitrogen gas atmosphere pressurized to a level selected to suppress release of boron nitride from the boron nitride container, thereby to prevent any substantial reaction of released boron nitride with the tungsten conductor component of the conductor patterns and resulting formation of tungsten boride producing an increased resistivity of the conductor patterns, the temperature and the duration of the primary-firing step being selected to achieve a desired high level of thermal conductivity of the fired said lamination, and in said secondary-firing step, firing said primary-fired lamination at a temperature in a temperature range of from 1400° C. to 1600° C. and in a non-oxidizing gas atmosphere not containing carbon, the temperature and the duration of the secondary-firing step being selected so as to decompose substantially all of any tungsten boride formed during the primary-firing step and thereby to eliminate said increased resistivity of the conductor patterns produced by the primary-firing step.

18. A process as recited in claim 17 further comprising performing the primary-firing step for approximately two hours.

19. A process as recited in claim 17 wherein the secondary-firing step is performed for approximately one hour.

20. A process according to claim 17, wherein said conductor paste contains a further component comprising aluminum nitride powder in an amount of up to 10 wt % of the weight of the main conductor component.

* * * * *